(12) United States Patent
Kawato

(10) Patent No.: US 6,529,087 B2
(45) Date of Patent: Mar. 4, 2003

(54) NOISE REMOVING FILTER FOR ELECTRONIC EQUIPMENT WITH A FERRITE FLANGED CORE

(75) Inventor: Kunio Kawato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/742,134

(22) Filed: Dec. 22, 2000

(65) Prior Publication Data

US 2001/0006363 A1 Jul. 5, 2001

(30) Foreign Application Priority Data

Dec. 24, 1999 (JP) .......................................... 11-368426

(51) Int. Cl.[7] ................................................ H01P 1/23
(52) U.S. Cl. .......................... 333/12; 333/182; 333/185; 439/620
(58) Field of Search ................................ 333/181, 182, 333/12, 185; 439/620

(56) References Cited

U.S. PATENT DOCUMENTS 4,761,147 A * 8/1988 Gauthier ..................... 439/607
5,373,277 A * 12/1994 Naito .......................... 336/92
5,969,583 A * 10/1999 Hutchison ................... 333/181
6,089,917 A * 7/2000 Anderson et al. ........... 439/620

FOREIGN PATENT DOCUMENTS

| JP | 2-2462000 | 10/1990 |
| JP | 3-6898 | 1/1991 |
| JP | 3-224299 | 10/1991 |
| JP | 5-37173 | 2/1993 |
| JP | 8-250887 | 9/1996 |
| JP | 9-17646 | 1/1997 |
| JP | 10-275994 | 10/1998 |
| JP | 11-214941 | 8/1999 |

* cited by examiner

Primary Examiner—Justin P. Bettendorf
(74) Attorney, Agent, or Firm—Sughrue Mion, PLLC

(57) ABSTRACT

In a noise removing filter for removing the electromagnetic wave noise leaking from an electronic equipment to the outside via a connector throughhole through which a connector passes, the noise removing filter includes a magnetic member filled in a gap between a body of the electronic equipment and the connector to cover the circumference of the connector.

11 Claims, 8 Drawing Sheets

NOISE REMOVING FILTER FOR ELECTRONIC EQUIPMENT WITH A FERRITE FLANGED CORE

BACKGROUND OF THE INVENTION

1. Field of the Invention

The present invention relates to an electronic apparatus such as a computer, and more particularly, to a noise removing filter for removing the electromagnetic wave noise leaking from the electronic equipment to the outside.

2. Description of the Related Art

Generally, in a computer apparatus, the electromagnetic wave noise leaks from a computer apparatus to the outside via a cable throughhole, and also, conduction noise is generated from a cable.

In order to suppress the above-mentioned electromagnetic wave noise and the conduction noise, a first prior art noise removing filter is constructed by a ferrite core wound on the cable and a copper foil tape filled in a gap between the ferrite core and the body of the computer apparatus.

In the above-described first prior art noise removing filter, however, since the manufacturing steps for winding the ferrite core and filling the copper foil tape are necessary, the manufacturing cost is increased.

A second prior art noise removing filter is constructed by an annular ferrite core having a throughhole through which a cable passes and an annular cover for fixing the annular ferrite core to a body of a computer apparatus (see JP-A-11-214941).

In the above-described second prior art noise removing filter, however, it is difficult for the inner surface of the annular cover to be adapted to the outer surface of the annular ferrite core, which would increase the manufacturing cost.

Also, the second prior art noise removing filter cannot be applied to an electronic equipment having a connector throughhole through which a connector passes.

SUMMARY OF THE INVENTION

It is an object of the present invention to provide a noise removing filter capable of decreasing the manufacturing cost.

According to the present invention, in a noise removing filter for removing the electromagnetic wave noise leaking from an electronic equipment to the outside via a connector throughhole through which a connector passes, the noise removing filter includes a magnetic member filled in a gap between a body of the electronic equipment and the connector to cover the circumference of the connector.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENTS

Figure 1A:
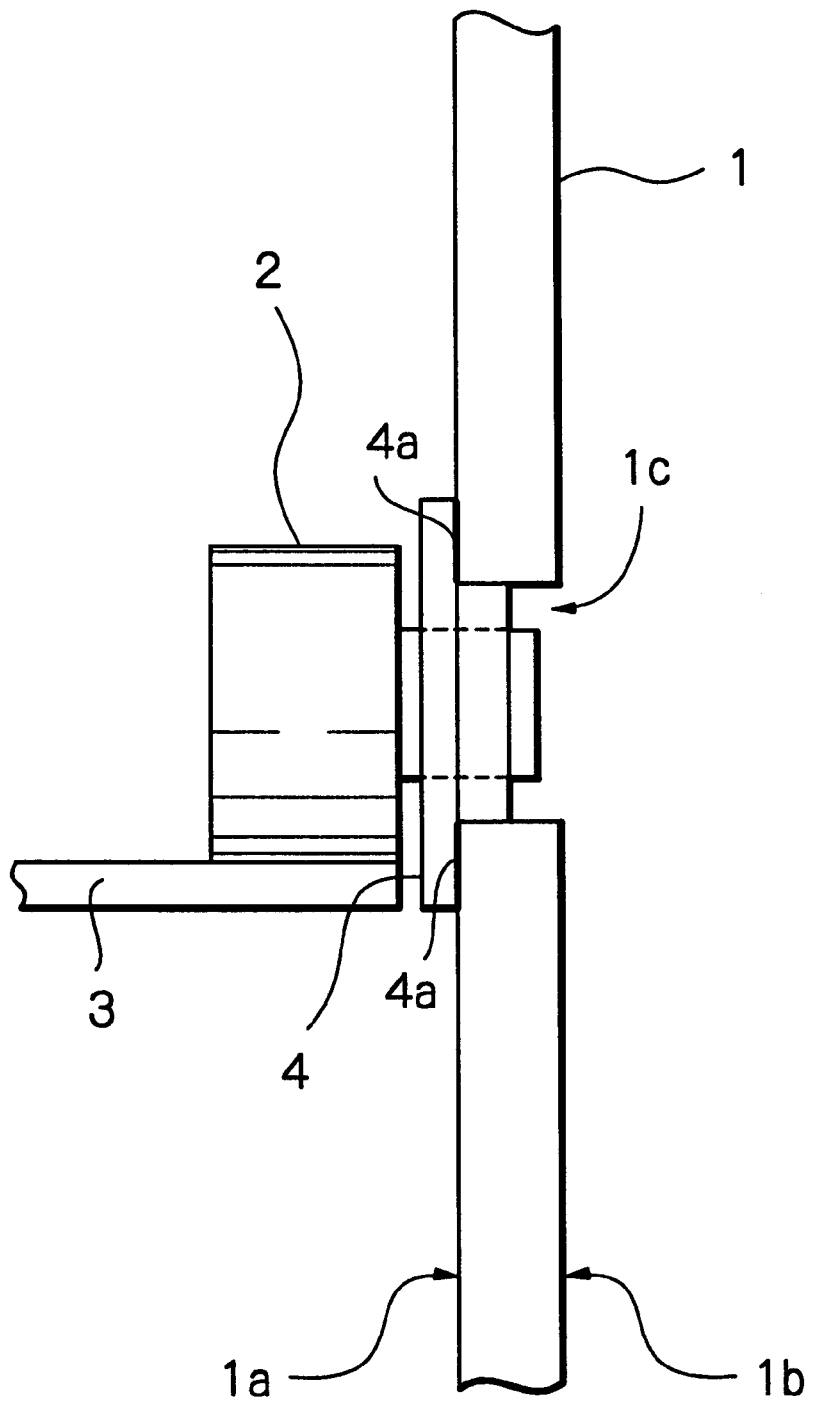
FIGS. 1A and 1B are side views illustrating a first embodiment of the noise removing filter according to the present invention mounted on a computer apparatus.
Figure 1B:
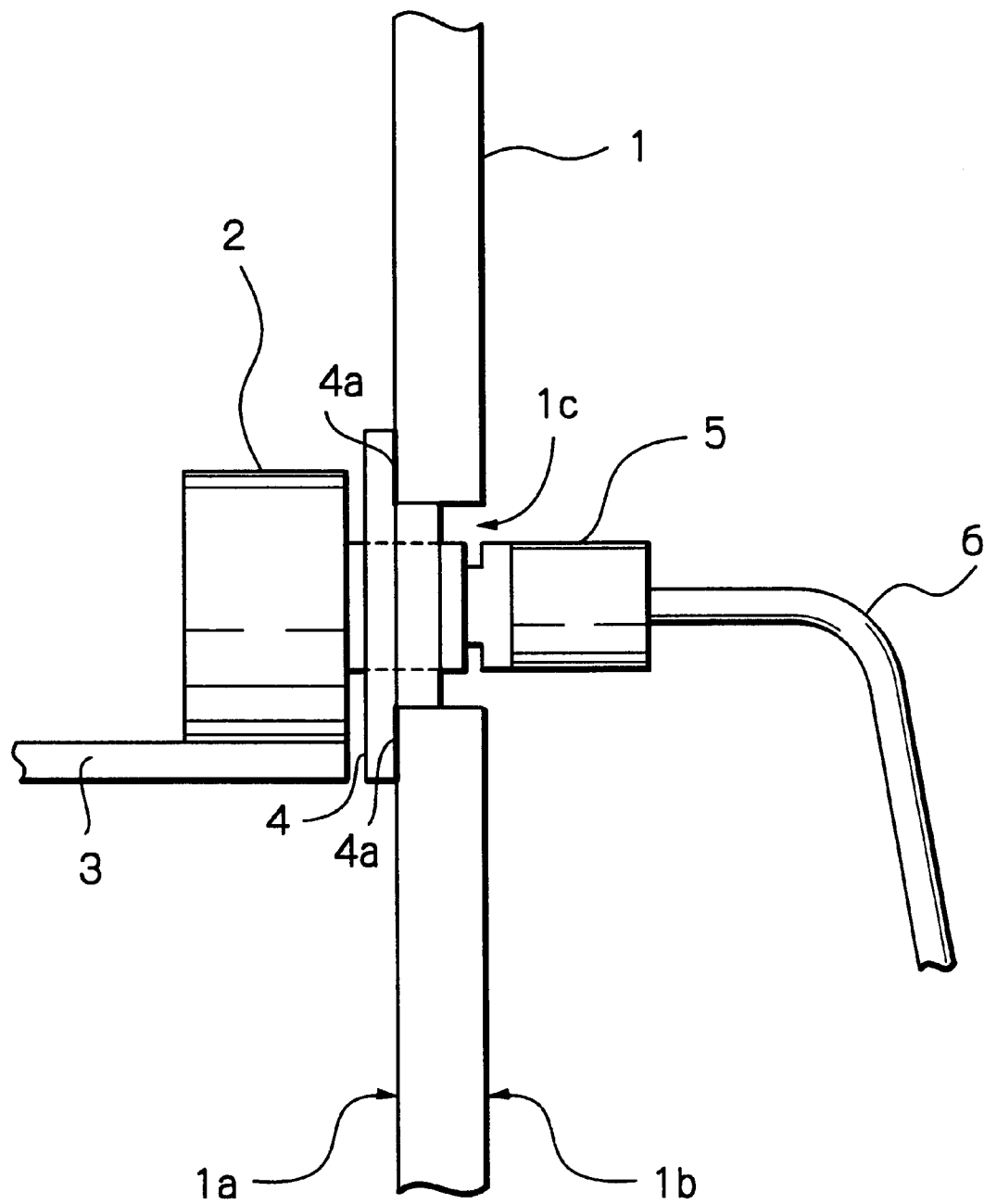

In FIGS. 1A and 1B, which illustrate a first embodiment of the present invention, reference numeral 1 designates a body of a computer apparatus (not shown) having an inner surface 1a, an outer surface 1b and a connector throughhole 1c through which a connector a jack 2 is fixed to a computer board 3.

In FIG. 1A, a noise removing filter 4 is filled in a gap between the body 1 and the connector jack 2 to cover the circumference of the connector jack 2. In this case, the noise removing filter 4 is mounted on the inner surface of the body 1 by a double-coated tape 4a, to completely fill the throughhole 1c.

Note that the double-coated tape 4a of FIGS. 1A and 1B can be replaced by bolts (not shown) inserted through the body 1 and the noise removing filter 4.

In FIG. 1B, a user puts a connector plug 5 connected to a cable 6 into the connector jack 2 of FIG. 1A.

Figure 2:
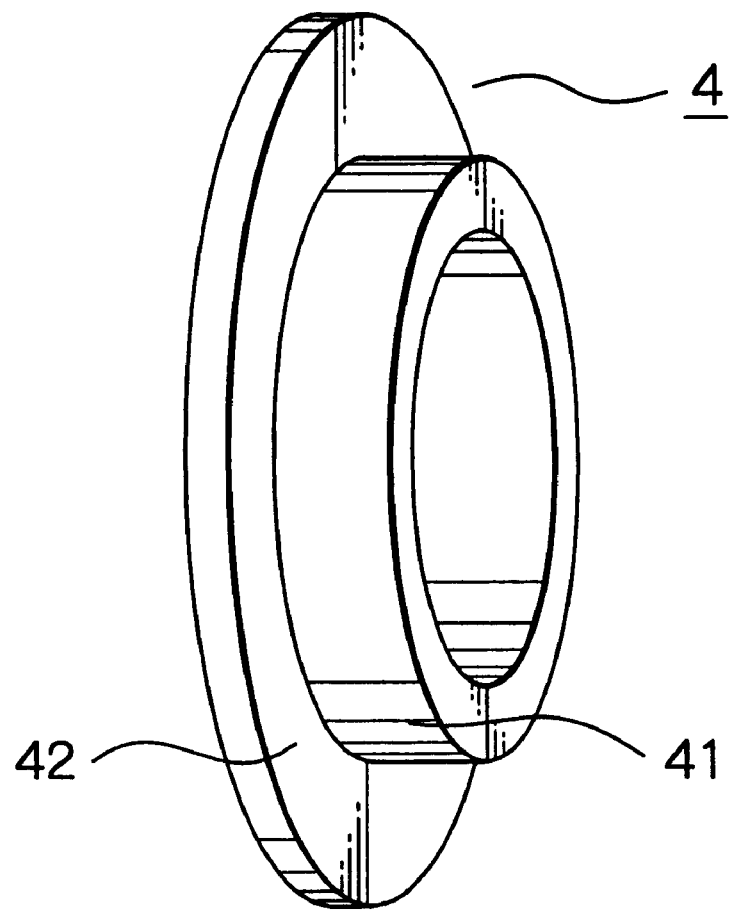
FIG. 2 is a perspective view of the noise removing filter of FIGS. 1A and 1B.

As illustrated in FIG. 2, the noise removing filter 4 of FIGS. 1A and 1B is constructed by a magnetic core section 41 which fills the gap between the body 1 and the connector jack 2 and a magnetic core section 42 connected to the magnetic core section 41 mounted on the inner surface of the body 1. That is, the combination of the magnetic core sections 41 and 42 form a flange member with a rim mounted on the inner surface of the body 1.

In FIG. 2, the magnetic core sections 41 and 42 are annular so as to be adapted to the shape of the throughhole 1c, which is also annular.

Figure 3:
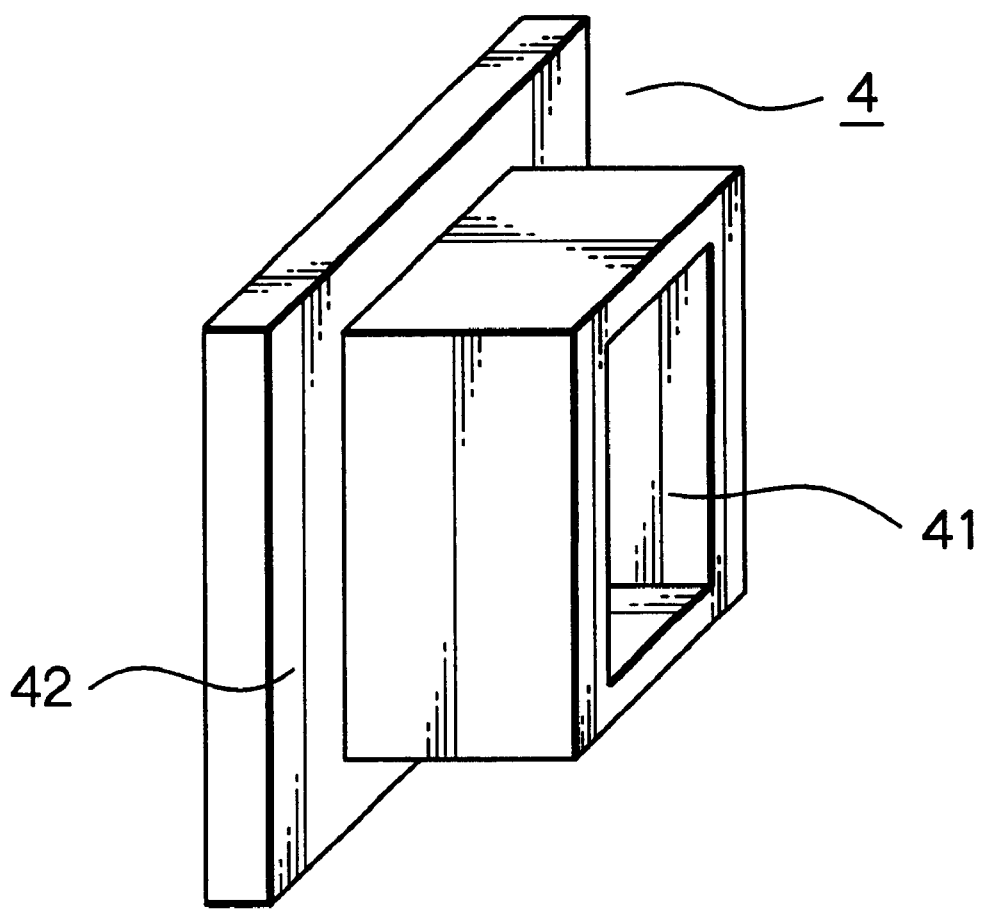
FIG. 3 is a perspective view of a modification of the noise removing filter of FIG. 2.

Note that, if the throughhole 1c is square or rectangular, the noise removing filter of FIG. 2 is also square or rectangular as illustrated in FIG. 3.

Figure 4A:
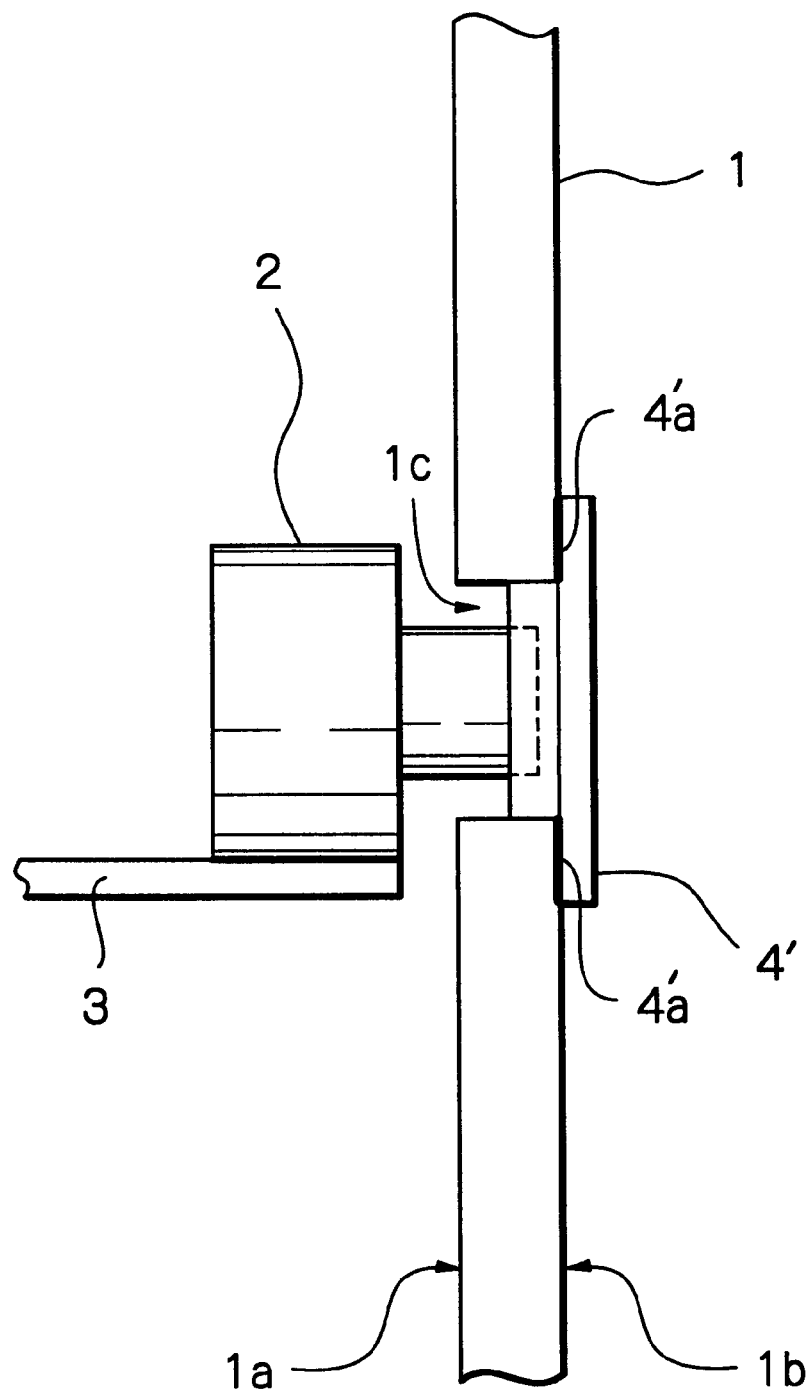
FIGS. 4A and 4B are side views illustrating a second embodiment of the noise removing filter according to the present invention mounted on a computer apparatus.
Figure 4B:
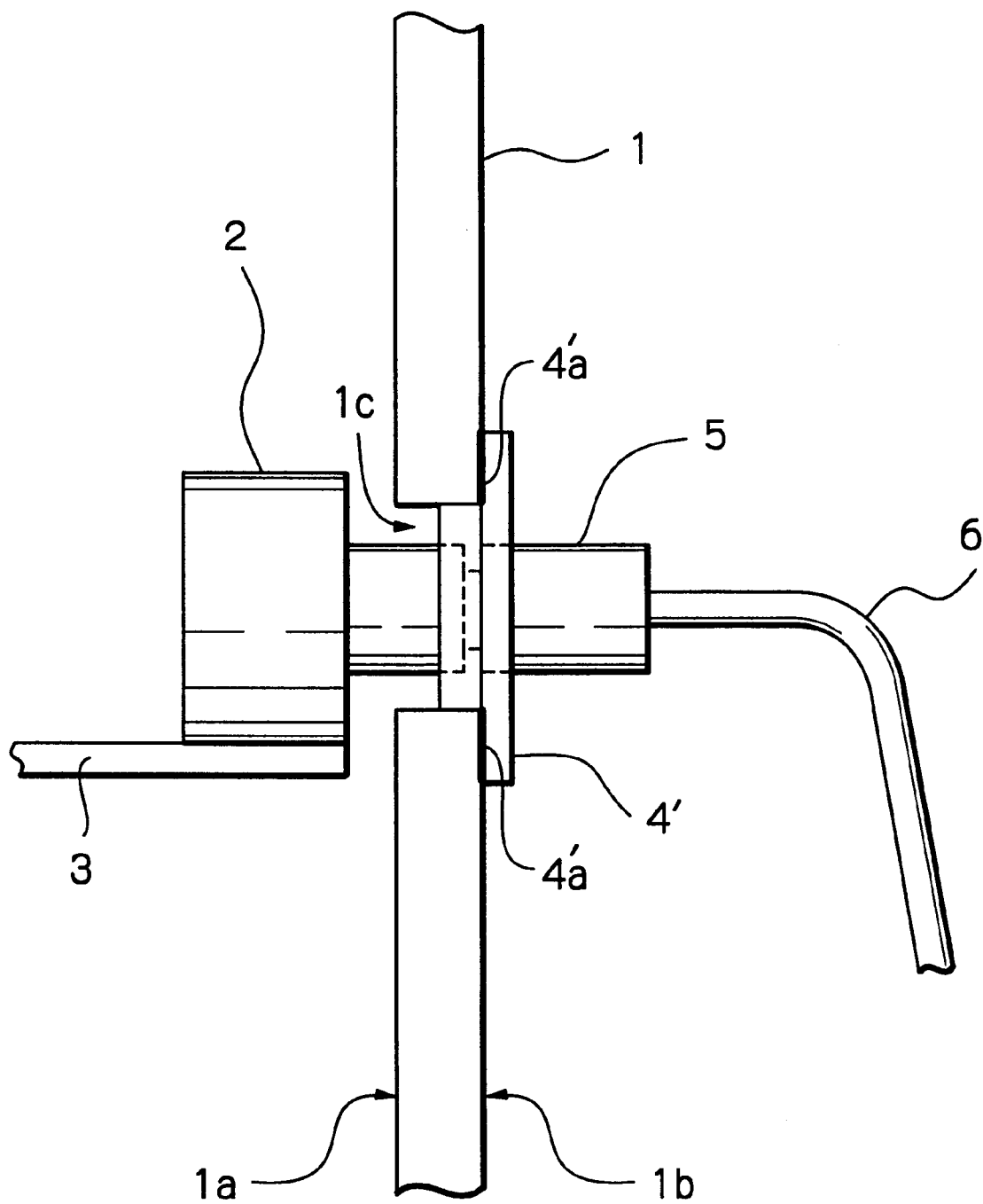

In FIGS. 4A and 4B, which illustrate a second embodiment of the present invention, the noise removing filter 4', which is the same as the noise removing filter 4 of FIGS. 1A and 1B, is mounted on the outer surface 1a of the body 1 by a double-coated tape 4'a, to completely fill the throughhole 1c.

Note that the double-coated tape 4'a of FIGS. 4A and 4B can be also replaced by bolts (not shown) inserted through the body 1 and the noise removing filter 4.

In FIG. 4B, a user puts a connector plug 5 connected to a cable 6 into the connector jack 2 of FIG. 4A via the noise removing filter 4'.

Figure 5A:
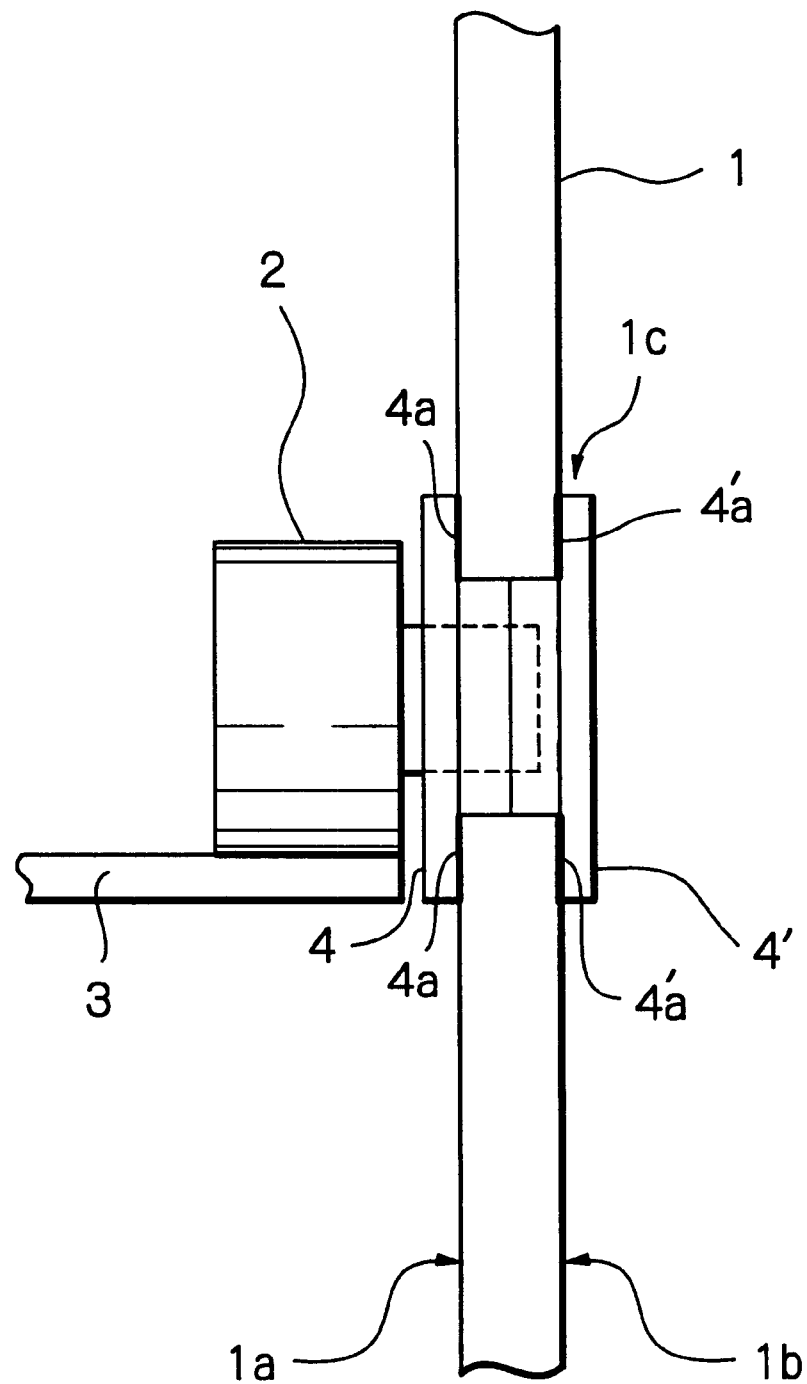
FIGS. 5A an 5B are side views illustrating a third embodiment of the noise removing filter according to the present invention mounted on a computer apparatus.
Figure 5B:
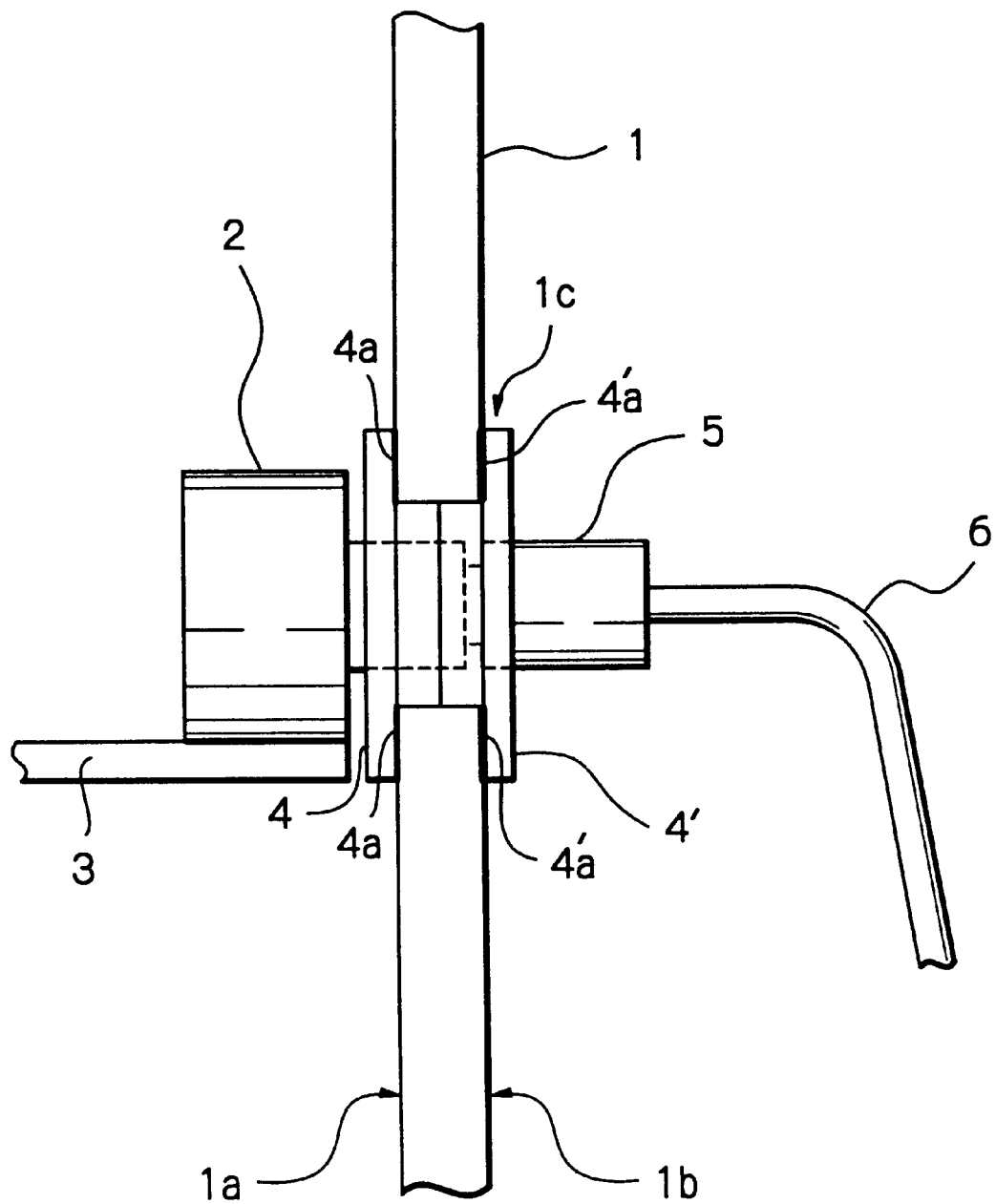

In FIGS. 5A and 5B, which illustrate a third embodiment of the present invention, the noise removing filter 5 is mounted on the inner surface 1a of the body 1, and also, the noise removing filter 4' is mounted on the outer surface 1b of the body 1. Even in this case, the noise removing filters 4 and 4' are mounted by double-coated tapes 4a and 4'a, to completely fill the throughhole 1c. The combination of the noise removing filters 4 and 4' serves as one noise removing filter.

Note that the double-coated tapes 4a and 4'a of FIGS. 5A and 5B can be also replaced by bolts (not shown) inserted through the body 1 and the noise removing filter 4.

In FIG. 5B, a user puts a connector plug 5 connected to a cable 6 into the connector jack 2 of FIG. 5A via the noise removing filters 4 and 4'.

In the above-described embodiments, the noise removing filter can remove the electromagnetic wave noise from the computer apparatus (not shown) as well as the conduction noise generated from the cable 6.

Also, the noise removing filter can be made of ferrite.

As explained hereinabove, according to the present invention, since the adaptation of an annular cover to an annular ferrite core is unnecessary, the manufacturing cost can be reduced.

What is claimed is:

1. A noise removing filter for removing the electromagnetic wave noise leaking from an electronic equipment to the outside via a connector throughhole through which a connector passes, said noise removing filter comprising a magnetic member filling a gap between a body of said electronic equipment and said connector to cover a circumference of said connector;

wherein said magnetic member comprises a first magnetic core mounted on a first surface of said body, and a second magnetic core mounted on a second surface of said body;

wherein said first and second magnetic cores comprise a pair of flange members filling the gap between said body and said connector, each of said flange members comprising a rim mounted on one of the first and second surfaces of said body; and wherein said flange members are made of ferrite.

2. A noise removing filter as set forth in claim 1, wherein said connector comprises a jack and a plug through which a cable passes.

3. The noise removing filter as set forth in claim 1, wherein said first and second magnetic cores are adapted to a shape of said connector.

4. The noise removing filter as set forth in claim 1, wherein each of said first and second magnetic cores comprises:

a first magnetic core section filling the gap between said body and said connector; and a second magnetic core section connected to said first magnetic core section and mounted on one of the first and second surfaces of said body.

5. An electronic apparatus comprising:

a body having a connector throughhole;

a connector jack passing through said connector throughhole; and a noise removing filter including a magnetic member filling a gap between said body and said connector jack to cover a circumference of said connector jack;

wherein said magnetic member comprises a first magnetic core mounted on a first surface of said body, and a second magnetic core mounted on a second surface of said body;

wherein said first and second magnetic cores comprise a pair of flange members filling the gap between said body and said connector, each of said flange members comprising a rim mounted on one of the first and second surfaces of said body; and wherein said flange members are made of ferrite.

6. The electronic apparatus as set forth in claim 5, wherein said first and second magnetic cores are adapted to a shape of said connector jack.

7. An electronic apparatus comprising:

a body having a connector throughhole;

a connector jack passing through said connector throughhole; and a noise removing filter including a magnetic member filling a gap between said body and said connector jack to cover a circumference of said connector jack;

wherein said magnetic member comprises a single magnetic core mounted on a surface of said body, wherein said single magnetic core comprises a flange member filling the gap between said body and said connector jack, said flange member comprising a rim mounted on a surface of said body, and wherein said flange member is made of ferrite.

8. The electronic apparatus as set forth in claim 7, wherein said single magnetic core is adapted to a shape of said connector.

9. The noise removing filter for removing the electromagnetic wave noise leaking from an electronic equipment to the outside via a connector throughhole through which a connector passes, said noise removing filter comprising a magnetic member filling a gap between a body of said electronic equipment and said connector to cover a circumference of said connector;

wherein said magnetic member comprises a single magnetic core mounted on a surface of said body;

wherein said single magnetic core comprises a flange member filling the gap between said body and said connector, said flange member comprising a rim mounted on a surface of said body; and wherein said flange member is made of ferrite.

10. The noise removing filter as set forth in claim 9, wherein said single magnetic core is adapted to a shape of said connector.

11. The noise removing filter as set forth in claim 9, wherein said single magnetic core comprises a first magnetic core section filling the gap between said body and said connector; and a second magnetic core section connected to said first magnetic core section and mounted on one of the first and second surfaces of said body.

* * * * *